us011441953B2

(12) United States Patent
Hosotani

(10) Patent No.: US 11,441,953 B2
(45) Date of Patent: Sep. 13, 2022

(54) POWER CIRCUIT MODULE

(71) Applicant: Murata Manufacturing Co., Ltd., Kyoto-fu (JP)

(72) Inventor: Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 344 days.

(21) Appl. No.: 16/717,690

(22) Filed: Dec. 17, 2019

(65) Prior Publication Data

US 2020/0124483 A1    Apr. 23, 2020

Related U.S. Application Data

(63) Continuation of application No. PCT/JP2018/023607, filed on Jun. 21, 2018.

(30) Foreign Application Priority Data

Jul. 7, 2017  (JP) .............................. JP2017-133324

(51) Int. Cl.
*G01K 1/14* (2021.01)
*H01L 23/34* (2006.01)
(Continued)

(52) U.S. Cl.
CPC ............. *G01K 1/14* (2013.01); *G01K 1/16* (2013.01); *G01K 7/22* (2013.01); *H01L 23/34* (2013.01);
(Continued)

(58) Field of Classification Search
CPC ... G01K 1/14; G01K 1/16; G01K 7/22; H01L 23/34; H01L 25/18; H05K 7/20; H05K 7/209; H05K 7/20945
See application file for complete search history.

(56) References Cited

U.S. PATENT DOCUMENTS 6,787,870 B2 * 9/2004 Wienand ................. H01L 23/34
257/713
8,148,812 B2 * 4/2012 Kise .................... H05K 7/20445
257/706
(Continued)

FOREIGN PATENT DOCUMENTS

JP      S51-6870 U      1/1976
JP      H03-283458 A    12/1991
(Continued)

OTHER PUBLICATIONS

International Search Report issued in PCT/JP2018/023607; dated Sep. 4, 2018.
(Continued)

*Primary Examiner* — Nathaniel T Woodward
*Assistant Examiner* — Philip L Cotey
(74) *Attorney, Agent, or Firm* — Studebaker & Brackett PC

(57) ABSTRACT

A power circuit module includes an electronic circuit board, a heat generating element mounted on a first surface of the electronic circuit board and being a semiconductor electronic component that constitutes a part of a power circuit, a temperature detecting element that detects the temperature of the heat generating element, an electric circuit wiring, a heat dissipating body that dissipates heat of the heat generating element, and a heat conduction sheet having elasticity and flexibility, and a thickness. The heat conduction sheet is between the heat generating element and the heat dissipating body, the temperature detecting element is thermally connected to the heat generating element via the heat conduction sheet and is electrically connected via the electric circuit wiring, and with regard to the sizes of the components, the following relationship holds: temperature detecting element<heat generating element<heat dissipating body.

21 Claims, 1 Drawing Sheet

(51) Int. Cl.
  *G01K 1/16* (2006.01)
  *G01K 7/22* (2006.01)
  *H01L 25/18* (2006.01)
  *H05K 7/20* (2006.01)

(52) U.S. Cl.
  CPC .............. *H01L 25/18* (2013.01); *H05K 7/20* (2013.01); *H05K 7/209* (2013.01); *H05K 7/20945* (2013.01)

(56) References Cited

U.S. PATENT DOCUMENTS

| | | | | |
|---|---|---|---|---|
| 8,500,034 | B2* | 8/2013 | Garber | G05D 23/19 236/78 D |
| 2002/0179289 | A1* | 12/2002 | Yamashita | H01L 23/3737 257/E23.087 |
| 2003/0227067 | A1* | 12/2003 | Wienand | H01L 23/34 257/467 |
| 2004/0195675 | A1* | 10/2004 | Rossetti | H01L 23/34 257/E23.08 |
| 2006/0074585 | A1* | 4/2006 | Reinberg | G01K 7/425 374/E7.043 |
| 2009/0210190 | A1* | 8/2009 | Carlson | G01K 3/005 702/130 |
| 2010/0254426 | A1* | 10/2010 | Okamoto | G01K 1/14 374/141 |
| 2011/0073668 | A1* | 3/2011 | Garber | G05D 23/19 236/101 R |
| 2012/0014059 | A1* | 1/2012 | Zeng | H05K 5/065 361/730 |
| 2013/0127037 | A1* | 5/2013 | Mori | H01L 25/0657 257/773 |
| 2013/0199770 | A1* | 8/2013 | Cherian | F28D 15/0275 165/185 |
| 2018/0174929 | A1* | 6/2018 | Tamanoi | H01L 22/14 |
| 2019/0077133 | A1* | 3/2019 | Sawaguchi | B32B 23/04 |

FOREIGN PATENT DOCUMENTS

| | | |
|---|---|---|
| JP | H09-027690 A | 1/1997 |
| JP | H09-175145 A | 7/1997 |
| JP | 2002-076236 A | 3/2002 |
| JP | 2002-124618 A | 4/2002 |
| JP | 2002-353385 A | 12/2002 |
| JP | 2011-033479 A | 2/2011 |
| JP | 2012-505528 A | 3/2012 |
| JP | 2014-107359 A | 6/2014 |
| JP | 2015-152502 A | 8/2015 |

OTHER PUBLICATIONS

International Preliminary Report On Patentability and Written Opinion Bsued in PCT/JP2018/023607; dated Jan. 7, 2020.

* cited by examiner

POWER CIRCUIT MODULE

CROSS-REFERENCE TO RELATED APPLICATIONS

This application claims benefit of priority to International Patent Application No. PCT/JP2018/023607, filed Jun. 21, 2018, and to Japanese Patent Application No. 2017-133324, filed Jul. 7, 2017, the entire contents of each are incorporated herein by reference.

BACKGROUND

Technical Field

The present disclosure relates to modularized power circuits and, more particularly, to a power circuit module including a structure for heat dissipation and temperature detection.

Background Art

In general, in the case where a protection operation of a heat generating body is performed during the operation of a device including the heat generating body, which constitutes a part of a power circuit, a temperature detecting means for detecting the temperature of the heat generating body is provided in the device. For example, Japanese Unexamined Patent Application Publication No. 2015-152502 discloses a structure including a heat conduction sheet, a heat generating body thermally connected to one end portion of the heat conduction sheet, and a temperature detecting element thermally connected to the other end portion of the heat conduction sheet, opposite to the one end portion, and in this structure, a heat insulating layer is provided on both sides of the heat conduction sheet between the one end portion and the other end portion.

SUMMARY

According to a temperature detection device illustrated in Japanese Unexamined Patent Application Publication No. 2015-152502, a highly accurate temperature detection is achieved because heat can be transmitted to the temperature detecting element in a state where the energy loss is small.

However, in general, to protect a heat generating element from overheating, it is important to not only detect the temperature of the heat generating element with a high degree of accuracy but also include a heat dissipating body that efficiently dissipates the heat of the heat generating element. Further, it is important to be able to detect the temperature at high speed in time, in response to the speed of a temperature increase in the heat generating body.

Accordingly, the present disclosure provides a power circuit module configured in such a manner as to be able to protect a power circuit incorporating a heat generating element by dissipating heat of the heat generating element and by detecting the temperature of the heat generating element at high speed in time with high responsiveness and high accuracy.

(1) A radio frequency power circuit module of the present disclosure includes an electronic circuit board on which an electronic component is mounted; a heat generating element mounted on a first surface of the electronic circuit board, the heat generating element generating heat in connection with conversion or control of power and being a semiconductor electronic component that constitutes a part of a power circuit; and a temperature detecting element mounted on the electronic circuit board, the temperature detecting element detecting temperature of the heat generating element. The radio frequency power circuit module further includes an electric circuit wiring formed on the electronic circuit board; a heat dissipating body that dissipates heat of the heat generating element, size of the heat dissipating body being set depending on a desired heat dissipation effect; and a heat conduction sheet having elasticity and flexibility, the heat conduction sheet having a thickness. The heat conduction sheet is placed between the heat generating element and the heat dissipating body. The temperature detecting element is thermally connected to the heat generating element via the heat conduction sheet and is electrically connected via the electric circuit wiring. Also, with regard to sizes of heat capacities of the temperature detecting element, the heat generating element, and the heat dissipating body, a following relationship holds: temperature detecting element<heat generating element<heat dissipating body.

The foregoing configuration enables to protect the power circuit by detecting the temperature of the heat generating element at high speed with high responsiveness and high accuracy using the temperature detecting element connected thereto not only thermally but also electrically while dissipating heat of the heat generating element to outside through the heat conduction sheet and the heat dissipating body.

(2) Preferably, the electronic circuit board is formed by single hot press lamination of a plurality of resin substrates including a resin substrate on which a copper foil pattern is formed, and is a flexible resin multilayer board in which the electric circuit wiring is formed on the electronic circuit board, and the resin substrate has a smaller relative permittivity, a smaller dielectric dissipation factor, and a smaller water absorption coefficient, compared with a resin material for a glass epoxy board.

The foregoing configuration enables the electronic circuit board to be thinner and more flexible and to be arranged into a predetermined spatially limited three-dimensional space, compared with a multilayer board having a structure in which one substrate and another substrate are adhered with an adhesion layer interposed therebetween. Further, this enables the electronic circuit board to have excellent radio frequency characteristics.

(3) Preferably, with regard to sizes of the thermal resistances among the temperature detecting element, the heat generating element, and the heat dissipating body, when a thermal resistance between the heat generating element and the temperature detecting element is expressed as (heat generating element–temperature detecting element), a thermal resistance between the heat generating element and the heat dissipating body is expressed as (heat generating element–heat dissipating body), and a thermal resistance between the temperature detecting element and the heat dissipating body is expressed as (temperature detecting element–heat dissipating body), a following relationship holds:

(heat generating element–temperature detecting element)<(heat generating element–heat dissipating body)<(temperature detecting element–heat dissipating body).

In this way, under the relationship that the heat capacity of the temperature detecting element is smaller than the heat capacity of the heat dissipating body, when the thermal resistance between the heat generating element and the temperature detecting element is smaller than the thermal resistance between the heat generating element and the heat dissipating body, the temperature of the heat generating element can be detected using the temperature detecting element before the temperature of the heat dissipating body increases. This enables to suppress a temperature increase of the heat dissipating body by stopping the operation of the power circuit module or the like before the temperature of the heat dissipating body increases.

(4) Preferably, a second surface side heat conduction sheet in contact with a second surface of the electronic circuit board, the second surface being an opposite surface of the first surface, and a second surface side heat dissipating body in contact with the second surface side heat conduction sheet are further included. This increases a heat dissipation effect. Further, even in the case where the size of the heat dissipating body or the number of the heat dissipating bodies is changed in response to the heat generation amount of the heat generating element, the temperature of the heat generating element can be detected accurately without changing the detected value of the temperature detecting element, thereby enabling to protect the power circuit.

(5) Preferably, the electric circuit wiring is thermally connected to the heat generating element and the temperature detecting element. This enables the heat generating element and the temperature detecting element to be thermally coupled to each other not only through the heat conduction sheet but also through the electric circuit wiring, thereby enabling to detect the temperature in such a manner as to be responsive to a temporal temperature change of the heat generating element.

(6) Preferably, a plurality of the heat generating elements is mounted on the electronic circuit board, the heat conduction sheet is thermally coupled to the plurality of the heat generating elements, and the temperature detecting element is placed near a high temperature heat generating element so as to have a largest thermal coupling between the temperature detecting element and the high temperature heat generating element and detects a temperature of the high temperature heat generating element, the high temperature heat generating element being one of the plurality of the heat generating elements and having a highest generated-heat temperature. This enables to protect the heat generating element that is most in need of protection.

(7) Preferably, the heat generating element is a compound semiconductor such as gallium nitride, silicon carbide, or the like. This enables to realize a loss reduction (conduction loss reduction) using a low current path resistance (ON resistance) and handle high speed switching, thereby achieving a size reduction of an inductance element or a capacitance element. Further, this enables a high temperature operation, thereby achieving size reduction of the heat dissipating body. Because of these, a high-power power circuit module can be formed despite of its small size.

The present disclosure enables to obtain a power circuit module configured in such a manner as to be able to protect a power circuit including a heat generating element by detecting the temperature of the heat generating element at high speed with high responsiveness and high accuracy while dissipating the heat of the heat generating element. Further, for example, even in the case where the power loss in the heat generating element is large, the case where the size of the heat dissipating body is increased in response to a large power loss, and any other similar cases, the temperature can still be detected at high speed with high responsiveness, thereby enabling to design in such a way that the detected temperature value of the temperature detecting element is set as a fixed predetermined value. Accordingly, the maximum temperature of the heat generating body can be limited to a predetermined value flexibly in response to the size of power loss in the heat generating element or the size of heat dissipation amount of the heat dissipating body.

DETAILED DESCRIPTION

First Embodiment

Figure 1:
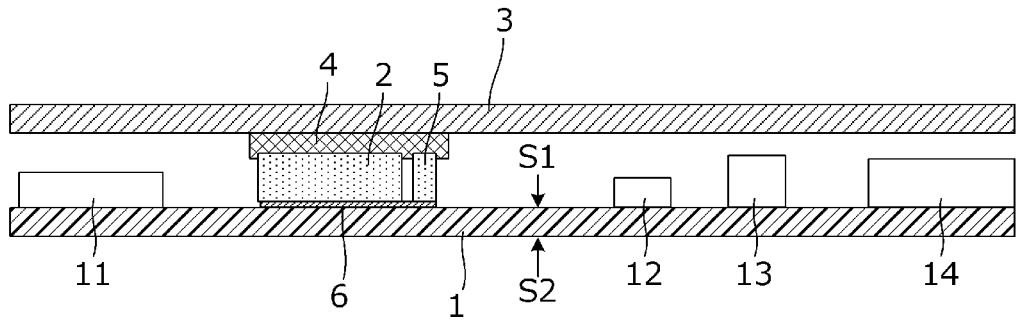
FIG. 1 is a vertical cross-sectional view of a major part of a power circuit module according to a first embodiment.

FIG. 1 is a vertical cross-sectional view of a major part of a power circuit module 101 according to the first embodiment. This power circuit module 101 includes an electronic circuit board 1, a heat generating element 2, a temperature detecting element 5, an electric circuit wiring 6, a heat dissipating body 3, and a heat conduction sheet 4.

For example, the heat generating element 2 is a semiconductor electronic component, is mounted on a first surface S1 of the electronic circuit board 1, and constitutes a part of a power circuit. The heat generating element 2 generates heat due to conduction loss or switching loss in connection with conversion or control of power by the power circuit. The temperature detecting element 5 detects the temperature of the heat generating element 2. The electric circuit wiring 6 is formed on the electronic circuit board 1. The heat dissipating body 3 dissipates heat of the heat generating element 2. The heat conduction sheet 4 has elasticity and flexibility and has a thickness.

The electronic circuit board 1 is a circuit board such as a glass epoxy circuit board, a resin multilayer board in which liquid crystal polymer or the like is used as a main material of a substrate, a flexible board whose substrate is a polyimide film, or the like. In this first surface S1, the heat generating element 2, the temperature detecting element 5, and the other circuit components 11, 12, 13, 14, and the like are mounted. In particular, in FIG. 1, the electric circuit wiring 6 connected thermally to the heat generating element 2 and the temperature detecting element 5 is clearly illustrated.

The foregoing electronic circuit board 1 is formed by single hot press lamination of a plurality of resin substrates including a resin substrate on which a copper foil pattern is formed, and is preferably a flexible resin multilayer board in which an electric circuit wiring is formed from the foregoing copper foil pattern. In particular, it is preferable that the resin substrate has a smaller relative permittivity, a smaller dielectric dissipation factor, and a smaller water absorption coefficient, compared with a resin material for a glass epoxy board. Using such an electronic circuit board 1 enables to provide a thinner flexible board that can be arranged into a predetermined spatially limited three-dimensional space, compared with a multilayer board having a structure in which one substrate and another substrate are adhered with an adhesion layer interposed therebetween as in the glass epoxy board, for example. Further, this enables to provide an electronic circuit board having excellent radio frequency characteristics.

The heat dissipating body 3 is, for example, a part of a housing made up of a shaped metal plate of Al, Fe, Cu, or the like or a molded resin body. This heat dissipating body 3 is unified with another structural member not illustrated in FIG. 1. This determines spatial relationships of the heat dissipating body 3 with respect to the heat conduction sheet 4, the heat generating element 2, the temperature detecting element 5, and the like.

The heat generating element 2 is, for example, a switching element of a DC-DC converter and is a surface-mount type MOS-FET. The temperature detecting element 5 is, for example, a surface-mount type thermistor element.

The heat conduction sheet 4 is a heat dissipating silicone rubber containing filler having a high thermal conductivity for improving its heat dissipation property. This heat conduction sheet 4 is arranged in such a state that the heat conduction sheet 4 is interposed between the heat generating element 2 and the heat dissipating body 3 and between the temperature detecting element 5 and the heat dissipating body 3.

The heat generating element 2 and the temperature detecting element 5 are connected to the electric circuit wiring 6 not only electrically but also thermally. Accordingly, the heat generating element 2 and the temperature detecting element 5 are coupled to each other thermally through the electric circuit wiring 6.

With regard to the sizes of heat capacities of the temperature detecting element 5, the heat generating element 2, and the heat dissipating body 3, the following relationship holds temperature detecting element<heat generating element<heat dissipating body. In other words, the heat capacity of the temperature detecting element 5 is smaller than the heat capacity of the heat generating element 2, and the heat capacity of the heat dissipating body 3 is larger than the heat capacity of the heat generating element 2. This relationship enables to protect the power circuit by detecting the temperature of the heat generating element 2 at high speed with high responsiveness and high accuracy using the temperature detecting element 5 while dissipating heat of the heat generating element 2 to outside via the heat conduction sheet 4 and the heat dissipating body 3. Further, for example, even in the case where the power loss in the heat generating element is large, the case where the size of the heat dissipating body is increased in response to a large power loss, and any other similar cases, the temperature can still be detected at high speed with high responsiveness, and thus the maximum temperature of the heat generating body can be set at a predetermined value by designing in such a way that the detected temperature value of the temperature detecting element is set as a fixed predetermined value. Further, the maximum temperature of the heat generating body can be limited to a predetermined value flexibly in response to the size of power loss in the heat generating element or the size of the heat dissipation amount of the heat dissipating body.

Further, here, when a thermal resistance between the heat generating element 2 and the temperature detecting element 5 is expressed as (heat generating element–temperature detecting element), a thermal resistance between the heat generating element 2 and the heat dissipating body 3 is expressed as (heat generating element–heat dissipating body), and a thermal resistance between the temperature detecting element 5 and the heat dissipating body 3 is expressed as (temperature detecting element–heat dissipating body), the following relationship holds: (heat generating element–temperature detecting element)<(heat generating element–heat dissipating body)<(temperature detecting element–heat dissipating body). In this way, under the relationship that the heat capacity of the temperature detecting element 5 is smaller than the heat capacity of the heat dissipating body 3, when the thermal resistance between the heat generating element 2 and the temperature detecting element 5 is smaller than the thermal resistance between the heat generating element 2 and the heat dissipating body 3, the temperature of the heat generating element 2 can be detected using the temperature detecting element 5 before the temperature of the heat dissipating body 3 increases. This enables to suppress a temperature increase of the heat dissipating body 3 by stopping the operation of the power circuit or the like before the temperature of the heat dissipating body 3 increases.

Figure 2:
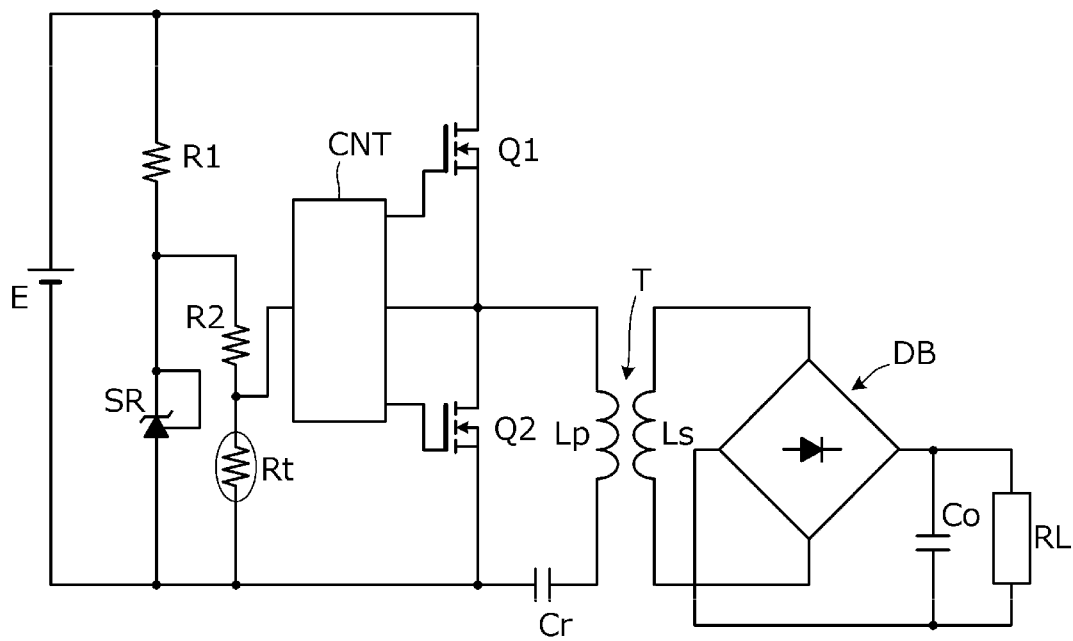
FIG. 2 is an example of a circuit diagram of a power circuit.

FIG. 2 is an example of a circuit diagram of the foregoing power circuit. This power circuit is a DC-DC converter. In FIG. 2, switch elements Q1 and Q2 and a resonant capacitor Cr are provided on the primary side of a transformer T. A diode bridge DB, a smoothing capacitor Co, and a load RL are provided on the secondary side of the transformer T. The switch elements Q1 and Q2 correspond to the heat generating element 2 illustrated in FIG. 1.

The foregoing switch elements Q1 and Q2 are each a MOS-FET. A control circuit CNT applies a control voltage across the gate and the source of each of the switch elements Q1 and Q2.

Further, on the foregoing primary side, a constant voltage circuit made up of a resistor R1 and a shunt regulator SR is formed. An output of this constant voltage circuit is connected to a resistance voltage divider circuit made up of a resistor R2 and a thermistor Rt. The thermistor Rt corresponds to the temperature detecting element 5 illustrated in FIG. 1. Accordingly, the thermistor Rt is thermally coupled to the switch elements Q1 and Q2.

The control circuit CNT detects the temperature of the switch elements Q1 and Q2 by reading the output voltage of this resistance voltage divider circuit.

For example, in the case where the load RL is in an overload state and the heat generation amount of the switch elements Q1 and Q2 becomes too large, the temperature of the switch elements Q1 and Q2 reaches a predetermined upper limit value. Upon detecting such a state from the divided voltage obtained by the resistor R2 and the thermistor Rt, the control circuit CNT stops switching of the switch elements Q1 and Q2 or suppresses the output power.

The foregoing configuration enables to protect the power circuit by detecting the temperature of the heat generating element 2 at high speed with high responsiveness and high accuracy using the thermistor Rt while dissipating heat of the switch elements Q1 and Q2 to outside via the heat conduction sheet 4 and the heat dissipating body 3.

The foregoing switch elements Q1 and Q2 are preferably a switch element composed of a compound semiconductor such as gallium nitride (GaN) or silicon carbide (SiC) or the like. This enables to realize a loss reduction using a low current path resistance and handle high speed switching, thereby achieving a size reduction of an inductance element or a capacitance element. Further, this enables a high temperature operation, thereby achieving the size reduction of the heat dissipating body. Because of these, a high-power power circuit module can be formed despite of its small size.

In the example illustrated in FIG. 1, the heat conduction sheet 4 enters a space between the heat generating element 2 and the temperature detecting element 5. This is because when the heat conduction sheet 4 is interposed between the heat generating element 2 and the heat dissipating body 3 and between the temperature detecting element 5 and the heat dissipating body 3, the heat conduction sheet 4 is pushed into the space between the heat generating element 2 and the temperature detecting element 5.

More specifically, the heat generating element 2 and the temperature detecting element 5 are arranged in such a way that a side face of the heat generating element 2 and a side face of the temperature detecting element 5 are parallel to each other. Because of this, the side face of the heat generating element 2 and the side face of the temperature detecting element 5 are opposite to each other. The heat conduction sheet 4 enters the part where the side faces of the heat generating element 2 and the temperature detecting element 5 face each other. Further, the heat conduction sheet 4 is in contact with the side faces of the heat generating element 2 and the temperature detecting element 5, which face each other.

Because of this, the heat generating element 2 and the temperature detecting element 5 are thermally connected by the heat conduction sheet 4 at the part where the side faces of the heat generating element 2 and the temperature detecting element 5 face each other. In other words, the heat conduction sheet 4 not only thermally connects the heat generating element 2 and the temperature detecting element 5 at top faces thereof but also thermally connects the side faces of the heat generating element 2 and the temperature detecting element 5. Accordingly, the power circuit can be protected by measuring the temperature of the heat generating element 2 at high speed with high responsiveness and high accuracy using the temperature detecting element 5.

Further, the heat conduction sheet 4 comes into contact with all the side faces of the heat generating element 2 by being pressed onto the heat generating element 2. Further, the heat conduction sheet 4 comes into contact with all the side faces of the temperature detecting element 5 by being pressed onto the temperature detecting element 5. Accordingly, the power circuit can be protected by detecting the temperature of the heat generating element 2 at high speed with high responsiveness and high accuracy using the temperature detecting element 5.

Note that in the example illustrated in FIG. 1, the heat generating element 2 and the temperature detecting element 5 are not directly in contact with each other, and a gap is formed therebetween. Alternatively, the heat generating element 2 and the temperature detecting element 5 may be directly in contact with each other. Further, alternatively, a heat conducting member may be interposed in or may fill this gap part.

Further, of the two switch elements Q1 and Q2, the one having a higher generated-heat temperature may be thermally coupled to the thermistor Rt, which is the temperature detecting element. In other words, in the case where a plurality of heat generating elements is included, the heat conduction sheet 4 may be thermally coupled to the plurality of heat generating elements, and the temperature detecting element 5 may be placed near the one of the plurality of heat generating elements, whose generated-heat temperature becomes the highest.

Further, in the case where a plurality of heat generating elements is included, the temperature detecting element may be thermally coupled to the individual heat generating elements.

Second Embodiment

Figure 3:
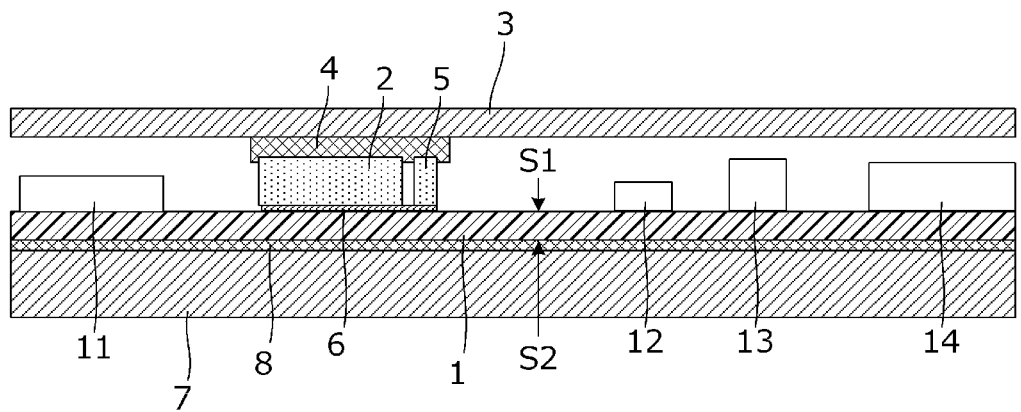
FIG. 3 is a vertical cross-sectional view of a major part of a power circuit module according to a second embodiment.

FIG. 3 is a vertical cross-sectional view of a major part of a power circuit module 102 according to a second embodiment. This power circuit module 102 includes an electronic circuit board 1, a heat generating element 2, a temperature detecting element 5, an electric circuit wiring 6, a heat dissipating body 3, a heat conduction sheet 4, a second surface side heat conduction sheet 8, and a second surface side heat dissipating body 7. The power circuit module 102 is different from the example illustrated in FIG. 1 in that the power circuit module 102 further includes the second surface side heat conduction sheet 8 and the second surface side heat dissipating body 7. The remaining configuration is the same as the configuration illustrated in the first embodiment.

The second surface side heat conduction sheet 8 is a heat dissipating silicone rubber similar to the heat conduction sheet 4 and is in contact with the second surface S2 that is an opposite surface to the first surface S1 of the electronic circuit board 1. The second surface side heat dissipating body 7 is, for example, a metal plate of Al, Fe, Cu, or the like or a molded resin body, and is in contact with the second surface side heat conduction sheet 8. This second surface side heat dissipating body 7 may be, for example, a part of a housing.

The present embodiment enables to increase the heat dissipation effect as a whole because of an additional heat dissipating function of the second surface side heat dissipating body 7. Therefore, in the case where the heat capacity or the area of the heat dissipating body 3 is rather small considering the heat generation amount of the heat generating element 2, a required heat dissipation effect can be achieved by providing the second surface side heat dissipating body 7.

Note that the thermal resistance between the heat generating element 2 and the temperature detecting element 5 is relatively small. Thus, as is the case with the present embodiment, even in the case where the second surface side heat dissipating body 7 is added according to the heat generation amount of the heat generating element 2, a detected temperature value of the heat generating element 2 obtained by the temperature detecting element 5 is less susceptible to the addition of the second surface side heat dissipating body 7. Accordingly, even in the case where the second surface side heat dissipating body 7 is added, the temperature of the heat generating element can be detected accurately, and the power circuit can be protected.

Lastly, the foregoing descriptions of the embodiments are exemplary in all aspects and are not restrictive. For a person skilled in the art, modifications and alterations are possible if appropriate. The scope of the disclosure is defined by the scope of claims and not by the foregoing embodiments. Furthermore, variations of the embodiments, which come within the scope of the claims and the range of equivalency of the claims, are included in the scope of the present disclosure.

What is claimed is:

1. A power circuit module comprising:
   an electronic circuit board on which an electronic component is mounted;
   at least one heat generating element mounted on a first surface of the electronic circuit board, the heat generating element generating heat in connection with conversion or control of power and being a semiconductor electronic component that constitutes a part of a power circuit;
   a temperature detecting element mounted on the electronic circuit board, the temperature detecting element detecting temperature of the heat generating element;
   an electric circuit wiring formed on the electronic circuit board;
   a heat dissipating body that dissipates heat of the heat generating element, size of the heat dissipating body being set depending on a desired heat dissipation effect; and a heat conduction sheet having elasticity and flexibility, the heat conduction sheet having a thickness,
wherein
the heat conduction sheet is between the heat generating element and the heat dissipating body,
the temperature detecting element is thermally connected to the heat generating element via the heat conduction sheet and the electric circuit wiring, and is electrically connected via the electric circuit wiring, and
with regard to sizes of heat capacities of the temperature detecting element, the heat generating element, and the heat dissipating body, a following relationship holds:

temperature detecting element<heat generating element<heat dissipating body.

2. The power circuit module according to claim 1, wherein
the electric circuit wiring is thermally connected to the heat generating element and the temperature detecting element.

3. The power circuit module according to claim 2, wherein
a plurality of the heat generating elements is mounted on the electronic circuit board,
the heat conduction sheet is thermally coupled to the plurality of the heat generating elements, and
the temperature detecting element is near a high temperature heat generating element so as to have a largest thermal coupling between the temperature detecting element and the high temperature heat generating element and detects a temperature of the high temperature heat generating element, the high temperature heat generating element being one of the plurality of the heat generating elements and having a highest generated-heat temperature.

4. The power circuit module according to claim 2, wherein
the heat generating element is a compound semiconductor including gallium nitride or silicon carbide.

5. The power circuit module according to claim 1, wherein
the heat generating element is a compound semiconductor including gallium nitride or silicon carbide.

6. The power circuit module according to claim 1, wherein
the temperature detecting element is thermally connected to the heat generating element via the electric circuit wiring such that the electric circuit wiring forms at least a portion of a thermal path between the temperature detecting element and the heat generating element.

7. A power circuit module comprising:
an electronic circuit board on which an electronic component is mounted;
at least one heat generating element mounted on a first surface of the electronic circuit board, the heat generating element generating heat in connection with conversion or control of power and being a semiconductor electronic component that constitutes a part of a power circuit;
a temperature detecting element mounted on the electronic circuit board, the temperature detecting element detecting temperature of the heat generating element;
an electric circuit wiring formed on the electronic circuit board;
a heat dissipating body that dissipates heat of the heat generating element, size of the heat dissipating body being set depending on a desired heat dissipation effect; and
a heat conduction sheet having elasticity and flexibility, the heat conduction sheet having a thickness,
wherein
the heat conduction sheet is between the heat generating element and the heat dissipating body,
the temperature detecting element is thermally connected to the heat generating element via the heat conduction sheet and is electrically connected via the electric circuit wiring, and
with regard to sizes of heat capacities of the temperature detecting element, the heat generating element, and the heat dissipating body, a following relationship holds:

temperature detecting element<heat generating element<heat dissipating body, the electronic circuit board is formed by single hot press lamination of a plurality of resin substrates including a resin substrate on which a copper foil pattern is formed, and is a flexible resin multilayer board in which the electric circuit wiring is formed on the electronic circuit board, and
the resin substrate has a smaller relative permittivity, a smaller dielectric dissipation factor, and a smaller water absorption coefficient, compared with a resin material for a glass epoxy board.

8. The power circuit module according to claim 7, wherein
with regard to sizes of the thermal resistances among the temperature detecting element, the heat generating element, and the heat dissipating body,
when a thermal resistance between the heat generating element and the temperature detecting element is expressed as (heat generating element−temperature detecting element), a thermal resistance between the heat generating element and the heat dissipating body is expressed as (heat generating element−heat dissipating body), and a thermal resistance between the temperature detecting element and the heat dissipating body is expressed as (temperature detecting element−heat dissipating body), a following relationship holds:

(heat generating element−temperature detecting element)<(heat generating element−heat dissipating body)<(temperature detecting element−heat dissipating body).

9. The power circuit module according to claim 7, wherein
the electric circuit wiring is thermally connected to the heat generating element and the temperature detecting element.

10. The power circuit module according to claim 7, wherein
a plurality of the heat generating elements is mounted on the electronic circuit board,
the heat conduction sheet is thermally coupled to the plurality of the heat generating elements, and
the temperature detecting element is near a high temperature heat generating element so as to have a largest thermal coupling between the temperature detecting element and the high temperature heat generating element and detects a temperature of the high temperature heat generating element, the high temperature heat generating element being one of the plurality of the heat generating elements and having a highest generated-heat temperature.

11. The power circuit module according to claim 7, wherein a plurality of the heat generating elements is mounted on the electronic circuit board, the heat conduction sheet is thermally coupled to the plurality of the heat generating elements, and the temperature detecting element is near a high temperature heat generating element so as to have a largest thermal coupling between the temperature detecting element and the high temperature heat generating element and detects a temperature of the high temperature heat generating element, the high temperature heat generating element being one of the plurality of the heat generating elements and having a highest generated-heat temperature.

12. The power circuit module according to claim 7, wherein the heat generating element is a compound semiconductor including gallium nitride or silicon carbide.

13. A power circuit module comprising:

an electronic circuit board on which an electronic component is mounted;

at least one heat generating element mounted on a first surface of the electronic circuit board, the heat generating element generating heat in connection with conversion or control of power and being a semiconductor electronic component that constitutes a part of a power circuit;

a temperature detecting element mounted on the electronic circuit board, the temperature detecting element detecting temperature of the heat generating element;

an electric circuit wiring formed on the electronic circuit board;

a heat dissipating body that dissipates heat of the heat generating element, size of the heat dissipating body being set depending on a desired heat dissipation effect; and a heat conduction sheet having elasticity and flexibility, the heat conduction sheet having a thickness, wherein the heat conduction sheet is between the heat generating element and the heat dissipating body, the temperature detecting element is thermally connected to the heat generating element via the heat conduction sheet and is electrically connected via the electric circuit wiring, and with regard to sizes of heat capacities of the temperature detecting element, the heat generating element, and the heat dissipating body, a following relationship holds:

temperature detecting element<heat generating element<heat dissipating body, with regard to sizes of the thermal resistances among the temperature detecting element, the heat generating element, and the heat dissipating body, when a thermal resistance between the heat generating element and the temperature detecting element is expressed as (heat generating element–temperature detecting element), a thermal resistance between the heat generating element and the heat dissipating body is expressed as (heat generating element–heat dissipating body), and a thermal resistance between the temperature detecting element and the heat dissipating body is expressed as (temperature detecting element–heat dissipating body), a following relationship holds:

(heat generating element–temperature detecting element)<(heat generating element–heat dissipating body)<(temperature detecting element–heat dissipating body).

14. The power circuit module according to claim 13, further comprising:

a second surface side heat conduction sheet in contact with a second surface of the electronic circuit board, the second surface being an opposite surface of the first surface; and a second surface side heat dissipating body in contact with the second surface side heat conduction sheet.

15. The power circuit module according to claim 13, wherein the electric circuit wiring is thermally connected to the heat generating element and the temperature detecting element.

16. The power circuit module according to claim 13, wherein the heat generating element is a compound semiconductor including gallium nitride or silicon carbide.

17. A power circuit module comprising:

an electronic circuit board on which an electronic component is mounted;

at least one heat generating element mounted on a first surface of the electronic circuit board, the heat generating element generating heat in connection with conversion or control of power and being a semiconductor electronic component that constitutes a part of a power circuit;

a temperature detecting element mounted on the electronic circuit board, the temperature detecting element detecting temperature of the heat generating element;

an electric circuit wiring formed on the electronic circuit board;

a heat dissipating body that dissipates heat of the heat generating element, size of the heat dissipating body being set depending on a desired heat dissipation effect;

a heat conduction sheet having elasticity and flexibility, the heat conduction sheet having a thickness;

a second surface side heat conduction sheet in contact with a second surface of the electronic circuit board, the second surface being an opposite surface of the first surface; and a second surface side heat dissipating body in contact with the second surface side heat conduction sheet, wherein the heat conduction sheet is between the heat generating element and the heat dissipating body, the temperature detecting element is thermally connected to the heat generating element via the heat conduction sheet and is electrically connected via the electric circuit wiring, and with regard to sizes of heat capacities of the temperature detecting element, the heat generating element, and the heat dissipating body, a following relationship holds:

temperature detecting element<heat generating element<heat dissipating body.

18. The power circuit module according to claim 17, wherein a plurality of the heat generating elements is mounted on the electronic circuit board, the heat conduction sheet is thermally coupled to the plurality of the heat generating elements, and the temperature detecting element is near a high temperature heat generating element so as to have a largest thermal coupling between the temperature detecting element and the high temperature heat generating element and detects a temperature of the high temperature heat generating element, the high temperature heat generating element being one of the plurality of the heat generating elements and having a highest generated-heat temperature.

19. The power circuit module according to claim 17, wherein
the heat generating element is a compound semiconductor including gallium nitride or silicon carbide.

20. A power circuit module comprising:
an electronic circuit board on which an electronic component is mounted;
a plurality of heat generating elements mounted on a first surface of the electronic circuit board, the plurality of heat generating elements generating heat in connection with conversion or control of power and each being a semiconductor electronic component that constitutes a part of a power circuit;
a temperature detecting element mounted on the electronic circuit board, the temperature detecting element detecting temperature of the plurality of heat generating elements;
an electric circuit wiring formed on the electronic circuit board;
a heat dissipating body that dissipates heat of the plurality of heat generating elements, size of the heat dissipating body being set depending on a desired heat dissipation effect; and
a heat conduction sheet having elasticity and flexibility, the heat conduction sheet having a thickness,
wherein
the heat conduction sheet is between the plurality of heat generating elements and the heat dissipating body,
the temperature detecting element is thermally connected to the plurality of heat generating elements via the heat conduction sheet and is electrically connected via the electric circuit wiring, and
with regard to sizes of heat capacities of the temperature detecting element, the plurality of heat generating elements, and the heat dissipating body, a following relationship holds:

$$\text{temperature detecting element} < \text{heat generating elements} < \text{heat dissipating body},$$

the heat conduction sheet is thermally coupled to the plurality of heat generating elements, and
the temperature detecting element is near a high temperature heat generating element so as to have a largest thermal coupling between the temperature detecting element and the high temperature heat generating element and detects a temperature of the high temperature heat generating element, the high temperature heat generating element being one of the plurality of heat generating elements and having a highest generated-heat temperature.

21. The power circuit module according to claim 20, wherein
the heat generating element is a compound semiconductor including gallium nitride or silicon carbide.

* * * * *